(12) United States Patent
Roy et al.

(10) Patent No.: US 9,583,209 B1
(45) Date of Patent: Feb. 28, 2017

(54) HIGH DENSITY MEMORY ARCHITECTURE

(71) Applicant: ARM Limited, Cambridge (GB)

(72) Inventors: Rajiv Kumar Roy, Bangalore (IN); Fakhruddin Ali Bohra, Austin, TX (US); Manish Trivedi, Bangalore (IN); Sumant Kumar Thapliyal, Bangalore (IN); Vikash, Bangalore (IN)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 14/963,111

(22) Filed: Dec. 8, 2015

(51) Int. Cl.
  *G11C 8/00* (2006.01)
  *G11C 17/08* (2006.01)
(52) U.S. Cl.
  CPC .................................. *G11C 17/08* (2013.01)
(58) Field of Classification Search
  CPC ................................... G11C 7/12; G11C 7/14
  USPC ........................................ 365/230.03, 230.06
  See application file for complete search history.

(56) References Cited

U.S. PATENT DOCUMENTS

| 6,980,462 | B1 | 12/2005 | Ramesh et al. | |
| 2006/0214687 | A1* | 9/2006 | Arora | H03K 19/0016 326/82 |
| 2006/0256604 | A1 | 11/2006 | Jacquet | |
| 2007/0002617 | A1* | 1/2007 | Houston | G11C 11/412 365/185.07 |
| 2009/0089482 | A1* | 4/2009 | Traister | G06F 12/0246 711/103 |
| 2010/0271855 | A1 | 10/2010 | Nirschl et al. | |
| 2014/0119147 | A1* | 5/2014 | Stephani | G11C 8/08 365/227 |
| 2014/0208156 | A1* | 7/2014 | Muralimanohar | G11C 5/04 714/6.24 |

OTHER PUBLICATIONS

Mustapa, et al.; Low power ROM employing dynamic threshold-voltage MOSFET (DTMOS) technique; IEEE International Conference on Semiconductor Electronics; pp. 103-107; Nov. 2008.

* cited by examiner

*Primary Examiner* — Han Yang
(74) *Attorney, Agent, or Firm* — Pramudji Law Group PLLC; Ari Pramudji

(57) ABSTRACT

Various implementations described herein are directed to an integrated circuit having high density memory architecture. The integrated circuit may include a plurality of bank arrays having multiple segments of bitcells configured to share local control. The integrated circuit may include a plurality of control lines coupling the local control to each of the multiple segments of bitcells. In some instances, during activation of a segment of bitcells by the local control via one of the control lines, another segment of bitcells may be deactivated by the local control via another of the control lines.

15 Claims, 6 Drawing Sheets

HIGH DENSITY MEMORY ARCHITECTURE

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Integrated circuits can be designed as memory. In Read-Only Memory (ROM) designs, low leakage and high density are important considerations. Low leakage can be achieved by selectively pulling a voltage supply line (VSB line) to 0 based on a selected column. However, density can be limited by a number of maximum bitcells that can be connected to a single bitline, which can decide a number of rows per bitcells or a number of rows per bank. The rows per bitline can be governed by a leakage of a bitcell, and the more leaky the bitcell, the lesser rows per bitline. Therefore, additional memory banks may be needed. In some cases, local input/output (IO) needed for each bank can increase a memory area by up to approximately 30%.

FIG. 1 shows a conventional bank type architecture 100 for ROM, where the entire memory can be divided into a number of banks. As shown, each bank can have top and bottom arrays sharing a same local IO (LIO) and sensing circuit. During operation, when any bitcell is accessed, the VSB line corresponding to a selected column is pulled low. Based on programming, the bitline (BL) either discharges or remains at VDD. The maximum number of rows that can be accommodated in each bank, (e.g., upper and lower) can be governed by leakage contribution coming from all unselected bitcells. Thus, banks may have to be duplicated, thus resulting in an increase in area to accommodate the logic associated with the local IO, which may further penalize the area.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to high density memory architecture for improving performance or reducing leakage. Such high density memory architecture may be implemented in Read-Only Memory (ROM) applications. In some implementations, high density ROM architecture may be configured with voltage supply lines/bitlines (VSB/BL) running in two metallization layers with half of the rows coupled to one (first) VSB/BL line and another half of the rows coupled to another (second) VSB/BL line thereby reducing the leakage in an accessed array and allowing more rows per bank, which may improve density. Further, based on programming of whether a BL is routed to a higher metallization layer or VSB line, the ROM design may be tuned to achieve either improved performance or reduced leakage, respectively. Accordingly, this unique way of using two VSB/BL lines within an array of bitcells may reduce a number of local IOs (local input/output), which may significantly reduce area and may offer flexibility in programming to select either a high performance design or a low leakage design.

In some implementations, high density memory architecture (e.g., ROM) may be configured with twisted voltage supply lines/bitlines (VSB/BL). For instance, in a memory bank, twisted voltage supply lines (VSB lines) may couple to half of the rows in one column and another half of the rows in an adjacent column thereby reducing leakage in an accessed column and allowing more rows per bank, which may also improve density. Further, bitlines (BL) may be twisted instead of the VSB lines such that the bitlines (BL) couple to half of the bitcells in one column and another half of the bitcells in an adjacent column. As such, this unique way of using twisted VSB lines (VSB lines) or twisted bitlines (BL) within an array of bitcells may reduce a number of local IOs, which may significantly reduce area. These and other features are described in greater detail herein.

Various implementations of high density memory architecture (e.g., ROM) will now be described in more detail with reference to FIGS. 2-6.

Figure 1:
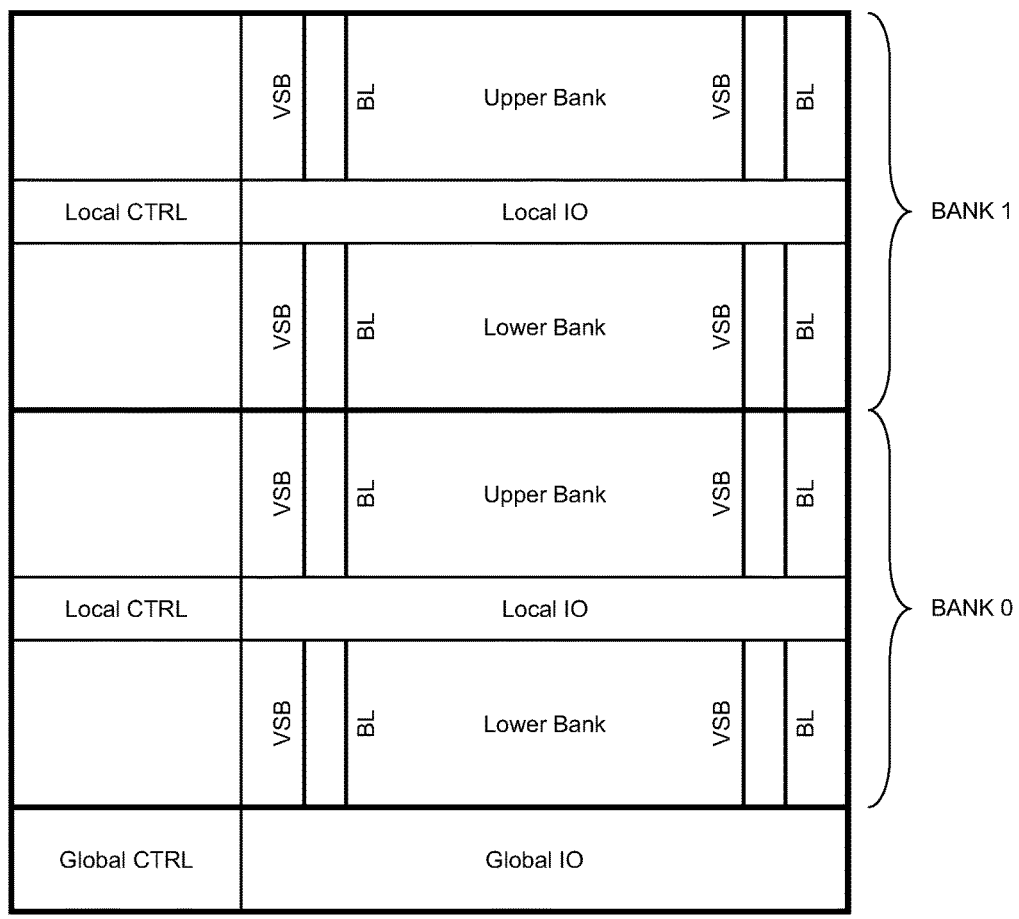
FIG. 1 illustrates a diagram of conventional memory as known in the art.
Figure 2:
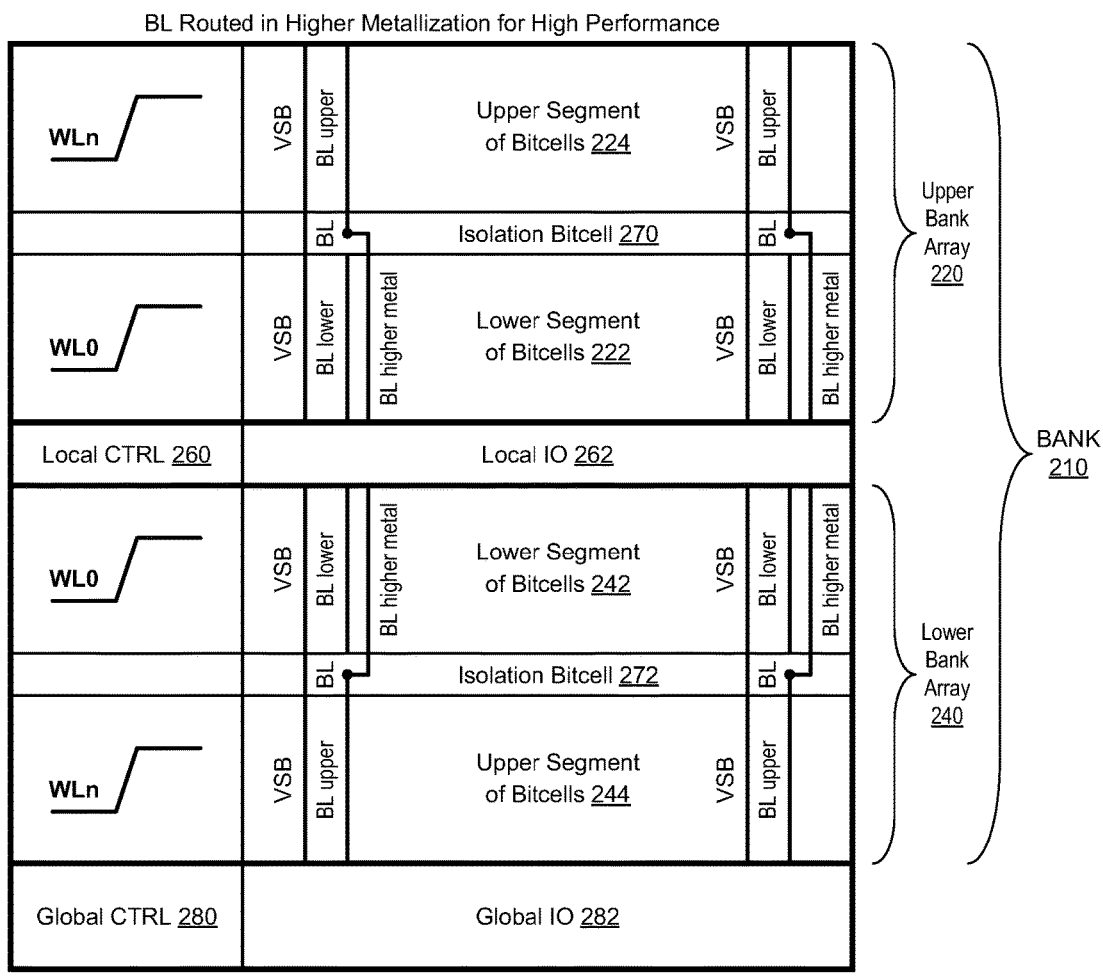
FIGS. 2-6 illustrate various diagrams of high density memory architecture in accordance with various implementations described herein.

FIG. 2 illustrates a block diagram of high density memory architecture 200 in accordance with various implementations described herein. The high density memory architecture 200 may be implemented in ROM as an integrated circuit with multiple banks having multiple bank arrays with segmented bitcells. In some implementations, the banks may be referred to as memory banks.

As shown in FIG. 2, the high density memory architecture 200 may include a plurality of control lines, including multiple bitlines BL and a voltage supply line VSB. The multiple bitlines BL may include lower bitlines (BL lower), upper bitlines (BL upper), and higher metal bitlines (BL higher metal). The bitlines BL may be referred to as read bitlines (RBL) or global bitlines (GBL). The bitlines BL and the voltage supply line VSB may be coupled to local control (Local CTRL), local IO (input/output), global control (global CTRL), and global IO, and the bitlines BL may be used to read one or more bits and/or bytes in memory, such as, e.g., ROM. In some implementations, each of the plurality of control lines (BL, VSB) may be implemented in a separate metallization layer.

The high density memory architecture 200 may include one or more memory banks 210 with each memory bank 210 having first and second bank arrays 220, 240 configured to share local control 260 (Local CTRL) and local IO 262 (Local Input/Output (IO)). The first and second bank arrays 220, 240 may be further configured to share global control 280 (Global CTRL) and global IO 282 (Global IO). The first bank array 220 may include a first segment of bitcells 222 and a second segment of bitcells 224 separated by an isolation cell 270 (isolation bitcell or layer), and the second bank array 240 may include a first segment of bitcells 242 and a second segment of bitcells 244 separated by another isolation cell 272 (isolation bitcell or layer). In some cases, the first segments of bitcells 222, 242 may be referred to as lower segments of bitcells, and the second segments of bitcells 224, 244 may be referred to as upper segments of bitcells.

The high density memory architecture 200 may include a plurality of control lines (VSB/BL). For instance, a first control line may be implemented as a first bitline (BL lower), and a second control line may be implemented as a second bitline (BL higher metal, BL upper). As such, the first bank array 220 may include a first bitline (BL lower) coupling the local control 260, 262 to the first segment of bitcells 222 and a second bitline (BL higher metal, BL upper) coupling the local control 260, 262 to the second segment of bitcells 224. Similarly, the second bank array 240 may include a first bitline (BL lower) coupling the local control 260, 262 to the first segment of bitcells 242 and a second bitline (BL higher metal, BL upper) coupling the local control 260, 262 to the second segment of bitcells 244. Each segment of bitcells 222, 224, 242, 244 of each bank array 220, 240 may include a plurality of bitcells arranged in columns and rows, and data stored in each of the bitcells is accessible via the first and second bitlines (BL lower, BL upper).

In some implementations, the plurality of control lines may include a voltage supply line (VSB) coupling the local control 260, 262 to the first and second segments of bitcells 222, 224, 242, 244. As such, voltage (e.g., source voltage) may be supplied to each of the bitcells via the voltage supply line VSB. Further, in some implementations, the supply voltage may be used and configured to provide an input source voltage of approximately 1.2V via the VSB line. In some other implementations, the supply voltage may be configured to provide an input voltage within a range of approximately 0.3V to 1.5V. In still some other implementations, the supply voltage may be configured to provide an input voltage within a range of approximately >0V to 3.3V.

In some implementations, during activation of the first segment of bitcells 222, 242 by the local control 260, 262 via the first bitline (BL lower), the second bitline (BL higher metal, BL upper) may be deactivated by the local control 260, 262. In some other implementations, during activation of the second segment of bitcells 224, 244 by the local control 260, 262 via the second bitline (BL higher metal, BL upper), the first bitline (BL lower) may be deactivated by the local control 260, 262. As described herein, this process of activation/deactivation may provide for high density memory architecture with multiple bitlines BL running in two metallization layers with one-half of the bitcells coupled to one bitline (BL lower) and another-half of the bitcells coupled to another bitline (BL higher metal, BL upper) thereby improving performance and/or reducing leakage in the accessed bank arrays 220, 240 and allowing more bitcells per bank 210, which may thus improve density. As such, using two bitlines (BL lower, BL upper) within each bank array of bitcells 222, 242, 224, 244 may reduce the number of Local IOs 262, which may significantly reduce physical area of the memory and may offer flexibility to select a high performance architecture or a low leakage architecture. In some cases, activating and deactivating the first and second bitlines (BL lower, BL upper) may increase performance of the integrated circuit 200. Accordingly, bitlines BL may be routed in higher metallization layers for high performance of the integrated circuit 200.

Figure 3:
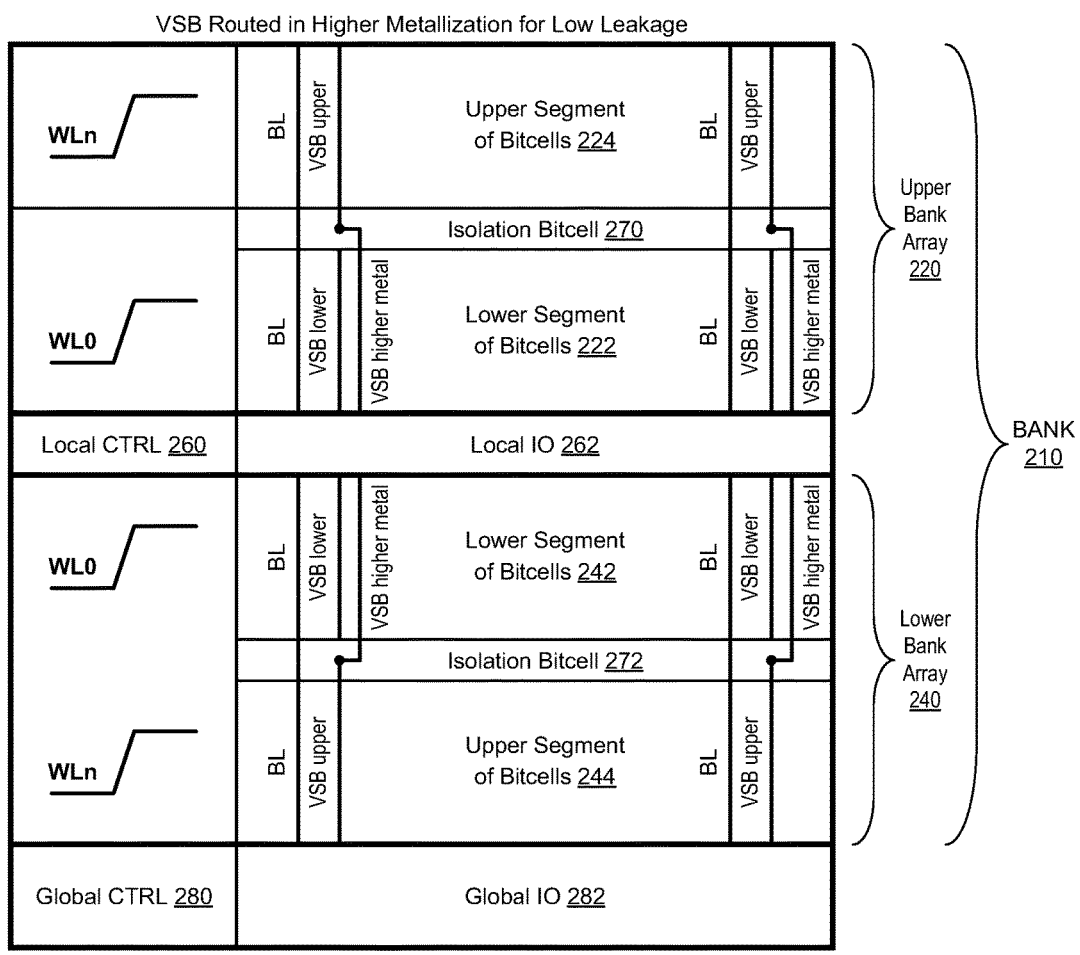

FIG. 3 illustrates a block diagram of another high density memory architecture 300 in accordance with various implementations described herein. As provided herein, the high density memory architecture 300 may be implemented in ROM as an integrated circuit with multiple banks having multiple bank arrays with segmented bitcells.

As shown in FIG. 3, the high density memory architecture 300 may include a plurality of control lines, including multiple voltage supply lines VSB and a bitline BL. The multiple voltage supply lines VSB may include lower voltage supply lines (VSB lower), upper voltage supply lines (VSB upper), and higher metal voltage supply lines (VSB higher metal). The voltage supply lines VSB and the bitline BL may be coupled to local control (Local CTRL), local IO (input/output), global control (global CTRL), and global IO, and the bitline BL may be used to read one or more bits and/or bytes in memory, such as, e.g., ROM. In some implementations, each of the plurality of control lines (VSB, BL) may be implemented in a separate metallization layer.

The high density memory architecture 300 is similar to the high density memory architecture 200 of FIG. 2 with some modification. For instance, as with the architecture 200 of FIG. 2, the architecture 300 of FIG. 3 may include a plurality of control lines (VSB/BL). However, as shown in the architecture 300 of FIG. 3, the first control line may be implemented as a first voltage supply line (VSB lower), and a second control line may be implemented as a second voltage supply line (VSB higher metal, VSB upper). As such, the first bank array 220 may include a first voltage supply line (VSB lower) coupling the local control 260, 262 to the first segment of bitcells 222 and a second voltage supply line (VSB higher metal, VSB upper) coupling the local control 260, 262 to the second segment of bitcells 224. Similarly, the second bank array 240 may include a first voltage supply line (VSB lower) coupling the local control 260, 262 to the first segment of bitcells 242 and a second voltage supply line (VSB higher metal, VSB upper) coupling the local control 260, 262 to the second segment of bitcells 244. Further, each segment of bitcells 222, 224, 242, 244 of each bank array 220, 240 may include a plurality of bitcells arranged in columns and rows, and voltage may be supplied to each of the bitcells via the first and second voltage supply lines (VSB lower, VSB upper).

In some implementations, in reference to the architecture 300 of FIG. 3, the plurality of control lines may include a bitline BL coupling the local control 260, 262 to the first and second segments of bitcells 222, 224, 242, 244. As such, the bitline BL may be used to couple the local control 260, 262 to the first and second segments of bitcells 222, 224, 242, 244, and data stored in each of the bitcells may be accessible by the local control 260, 262 via the bitline BL.

In some implementations, when voltage is supplied to the first segment of bitcells 222, 242 by local control 260, 262 via the first voltage supply line (VSB lower), the second voltage supply line (VSB higher metal, VSB upper) may be deactivated by the local control 260, 262. In some other implementations, when voltage is supplied to the second segment of bitcells 224, 244 by local control 260, 262 via the second voltage supply line (VSB higher metal, VSB upper), the first voltage supply line (VSB lower) may be deactivated by the local control 260, 262. Therefore, as described herein, this process of activation/deactivation may provide for high density memory architecture with multiple voltage supply line VSB running in two metallization layers with one-half of the bitcells coupled to one voltage supply line (VSB lower) and another-half of the bitcells coupled to another voltage supply line (VSB higher metal, VSB upper) thereby reducing leakage in the accessed bank arrays 220, 240 and allowing more bitcells per bank 210, which may improve density. As such, using two voltage supply lines (VSB lower, VSB upper) within each bank array of bitcells 222, 242, 224, 244 may reduce the number of Local IOs 262, which may significantly reduce physical area of the memory and may further offer flexibility to select a low leakage architecture. In some cases, activating and deactivating the first and second voltage supply lines (VSB lower, VSB upper) may reduce leakage of the integrated circuit 300. Accordingly, the voltage supply lines VSB may be routed in higher metallization layers for low leakage of the integrated circuit 300.

In reference to the architecture 300 of FIG. 3, for each column in the bank array 220, 240, two VSB lines (VSB lower, VSB upper) may be routed with one to the first VSB line (VSB lower) in lower metallization and the other to the second VSB line (VSB upper) in higher metallization (via VSB higher metal). Each half of the bank array (lower 220 and higher 240) may be divided into two parts or segments, e.g., lower and upper segments 222, 224, 242, 244, respectively. Further, based on the max rows that may be supported for proper bitcell functionality, the bitcells of each segment 222, 224, 242, 244 may be coupled to the first VSB lines (VSB lower) in lower metallization for the lower segments of bitcells 222, 242 and to the second VSB lines (VSB higher) in higher metallization for the upper segments of bitcells 224, 244. Further, multiple wordlines (WL0, WLn) may be used for selecting or accessing data in the lower segments of bitcells 222, 242 or upper segments of bitcells 224, 244. For instance, based on an input address, if a row in a lower segment 222, 242 is selected, the first VSB line (VSB lower) in lower metallization is pulled low, or else the second VSB line (VSB higher) in higher metallization is pulled to ground to access a selected bitcell. Therefore, in some cases, this feature offers low leakage as only half of the cells are coupled to a bitline BL leak. Further, this feature may reduce the number of memory banks and the logic associated with Local IO to thereby improve the memory area. In some cases, this high density architectural scheme may offer a substantial reduction (e.g., 15% reduction) in overall area.

In reference to the architecture 200 of FIG. 2, for each column in the bank array 220, 240, two bitlines BL (BL lower, BL upper) may be routed with one to the first bitline (BL lower) in lower metallization and the other to the second bitline (BL upper) in higher metallization. Further, each half of the bank array (lower 220 and higher 240) may be divided into two parts or segments, e.g., lower segments 222, 224 and upper segments 242, 244, respectively. Based on the max rows that may be supported for proper bitcell functionality, the bitcells of each lower segment 222, 242 may be coupled to the first bitlines (BL lower) in lower metallization, and the bitcells of each upper segment 224, 244 may be coupled to the second bitlines (BL upper) in higher metallization. Therefore, since the load on the bitlines is reduced when compared to the architecture 300 of FIG. 3, the architecture 200 of FIG. 2 may offer higher performance with a cost of leakage.

Accordingly, in some scenarios, the architecture 200 of FIG. 2 may refer to or at least may offer a high density memory architecture that provides bitline BL routing in higher metallization for high performance with a cost (or penalty) of high leakage. Further, in some other scenarios, the architecture 300 of FIG. 3 may refer to or at least may offer a high density memory architecture that provides voltage supply line VSB routing in higher metallization for low leakage with a cost (or penalty) of low performance.

Figure 4A:
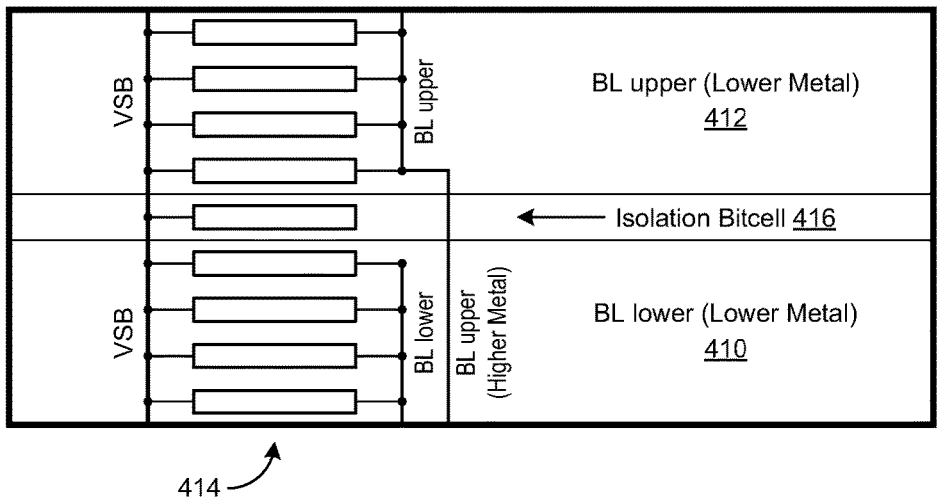
Figure 4B:
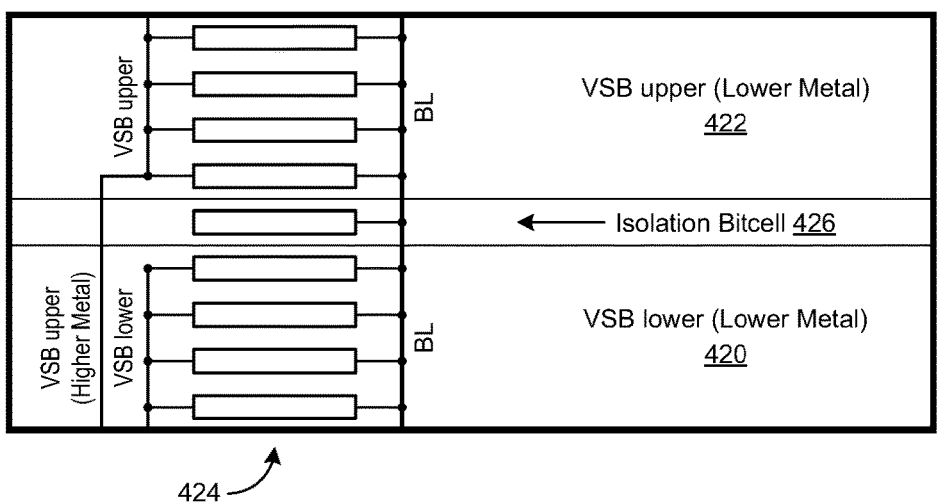

FIG. 4A illustrates a first block diagram of programming high density memory architecture 400A in reference to the architecture 200 of FIG. 2, and FIG. 4B illustrates a second block diagram of programming high density architecture 400B in reference to the architecture 300 of FIG. 3. In various implementations, programming may be used to select high performance or low leakage.

In a first programming scenario, as shown in reference to the architecture 400A of FIG. 4A, the voltage supply line (VSB) may be programmed to remain continuous in lower metallization layer, and the bitline (BL) may be programmed to run in the lower and higher metallization layers. In some cases, this first programming scenario provides for high performance with a possible cost (or penalty) of high leakage.

Further, as shown FIG. 4A, the architecture 400A may be divided into a lower segment of bitcells 410 and an upper segment of bitcells 412 that may be arranged in a column structure 414. In this arrangement, at least one dummy bitcell or isolation bitcell 416 may be sacrificed to isolate the two bitlines (BL lower, BL upper) based on DRC rules for a continuous active type of programming. Generally, Design Rule Checking (DRC) refers to an area of Electronic Design Automation (EDA) that determines whether a physical layout of an integrated circuit (IC) satisfies a series of recommended parameters or Design Rules. As further shown in FIG. 4A, the upper bitline (BL upper) may run in a higher metallization layer (higher metal) and may be shorted with a lower metallization layer (lower metal) to bypass the dummy/isolation bitcell 416 and 410.

In a second programming scenario, as shown in reference to the architecture 400B of FIG. 4B, the bitline (BL) may be programmed to remain continuous in lower metallization layer, and the voltage supply line (VSB) may be programmed to run in the lower and higher metallization layers. In some cases, this second programming scenario may provide for low leakage with a possible cost (or penalty) of low performance.

Further, as shown FIG. 4B, the architecture 400B may be divided into a lower segment of bitcells 420 and an upper segment of bitcells 422 that may be arranged in a column structure 424. In this arrangement, at least one dummy bitcell or isolation bitcell 426 may be sacrificed to isolate the two voltage supply lines (VSB lower, VSB upper) based on DRC rules for a continuous active type of programming. As further shown in FIG. 4B, the upper voltage supply line (VSB upper) may run in the higher metallization layer (higher metal) and may be shorted with the lower metallization layer (lower metal) to bypass the dummy/isolation bitcell 426 and 420.

In accordance with various implementations described herein, the VSB/BL lines may run in two separate metallization layers with a higher metal line running over a lower VSB/BL line. The memory banks may be divided into two segments, and each memory bank may be segmented in two sub-banks, e.g., lower and upper sub-banks. Further, each segment (lower and upper) may have its own local VSB/BL line specific to that segment. For a lower segment, the VSB/BL line may run in lower metallization, while for an upper segment, the VSB/BL line may run in both lower and upper metallization. One of the VSB/BL lines (lower or upper) may be toggled depending on which segment is being selected. Therefore, one segment may leak when a column is selected, while the other segment may remain in a leakage reduction mode. Programming allows tuning of the design to either high performance by routing a bitline BL in higher metallization or low leakage by routing a voltage supply line VSB in higher metallization.

Some conventional failures in ROM are due to differential voltage being overly reduced due to leakage. As such, the various implementations described herein enhance high density ROM design by reducing leakage. Further, it may provide improved flexibility to a designer to tune rows per bank and achieve a balance between high density and robust design. These ideas may be extended to reduce coupling between VSB lines and bitlines as the VSB run length may be reduced to half, which may thereby reduce the coupling. Further, area overhead may be reduced as fewer or no local IOs are needed to implement the ROM circuitry. These ideas may only need a one bitcell pitch.

Figure 5:
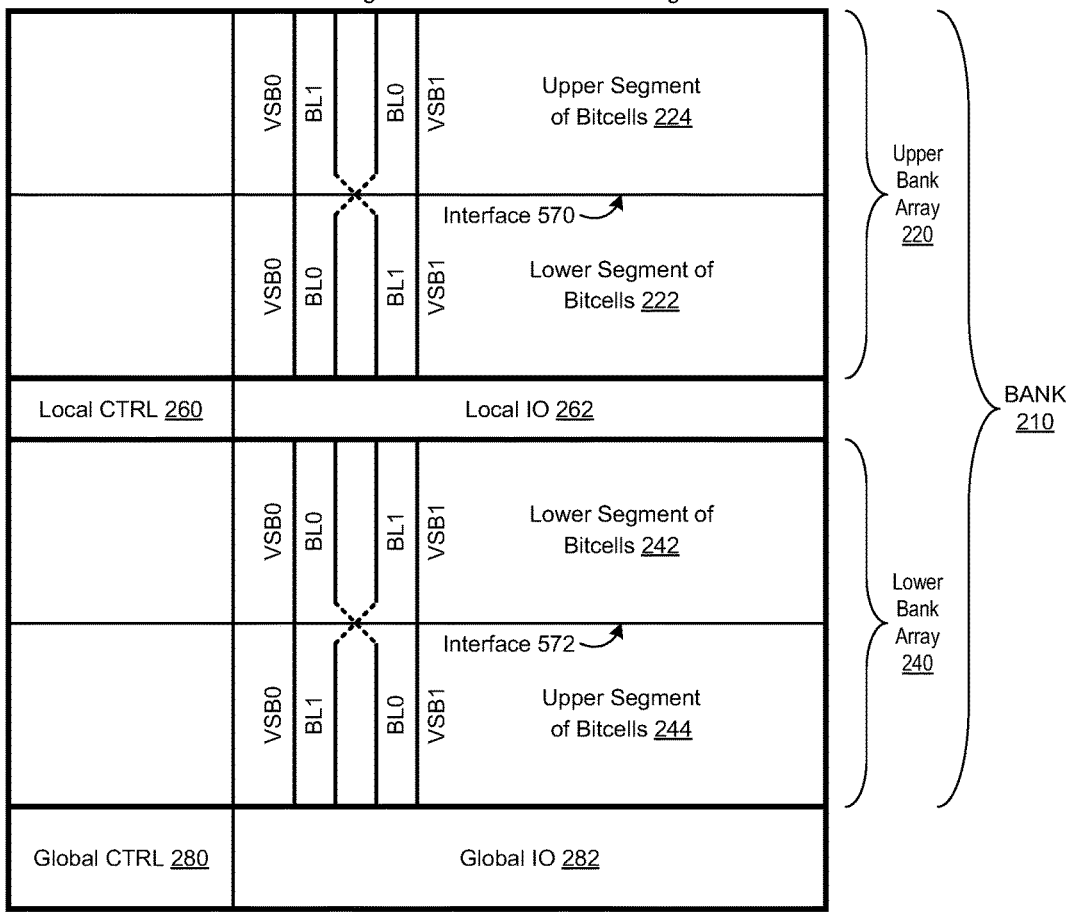

FIG. 5 illustrates a block diagram of another high density memory architecture 500 in accordance with various implementations described herein. As provided herein, the high density memory architecture 500 may be implemented in ROM as an integrated circuit with multiple banks having multiple bank arrays with segmented bitcells.

The high density memory architecture 500 is similar to the high density memory architecture 200 of FIG. 2 with some modification. For instance, as with the architecture 200 of FIG. 2, the architecture 500 of FIG. 5 may include a plurality of control lines (VSB/BL). However, as shown in the architecture 500 of FIG. 5, the plurality of control lines may include a plurality of continuous voltage supply lines (VSB0, VSB1) and a plurality of twisted bitlines (BL0, BL1). For instance, the first and second bitlines (BL0, BL1) may be routed in column 1 and column 2, respectively, in the first segment of bitcells 222, 242 and then routed in column 2 and column 1, respectively, in the second segment of bitcells 224, 244 at interfaces 570, 572 of the first and second segment of bitcells 222, 224, 242, 244. As shown in FIG. 5, this forms twisted bitline pairs (BL0, BL1). In some instances, the interfaces 570, 572 of the first and second segments of bitcells 222, 224, 242, 244 may refer to a shared boundary (or shared boundary line) disposed between the first and second segments of bitcells 222, 224, 242, 244.

Further, as shown in FIG. 5, the two adjacent bitlines (BL0, BL1) are twisted at the interfaces 570, 572 of the first (lower) and second (upper) segments of bitcells 222, 224, 242, 244. As shown, the first bitline (BL0) forms a BL-VSB pair with the first voltage supply line (VSB0) in the first (lower) segments 222, 242, while in the second (upper) segments 224, 244, the first bitline (BL0) forms a BL-VSB pair with the second voltage supply line (VSB1). Further, as shown, the second bitline (BL1) forms a BL-VSB pair with the second voltage supply line (VSB1) in the first (lower) segments 222, 242, while in the second (upper) segments 224, 244, the second bitline (BL1) forms a BL-VSB pair with the first voltage supply line (VSB0).

In some implementations, during activation of the first segment of bitcells 222, 242 by the local control 260, 262 via the first bitline (BL0), the second bitline (BL1) may be deactivated by the local control 260, 262. Further, during activation of the second segment of bitcells 224, 244 by the local control 260, 262 via the second bitline (BL1), the first bitline (BL0) may be deactivated by the local control 260, 262. In some instances, activating and deactivating the first and second bitlines (BL0, BL1) may increase performance or reduce leakage of the integrated circuit 500. The plurality of control lines may include voltage supply lines (VSB0, VSB1) coupling the local control 260, 262 to the first and second segments of bitcells 222, 224, 242, 244, and voltage may be supplied to each of the bitcells via the voltage supply lines (VSB0, VSB1).

Figure 6:
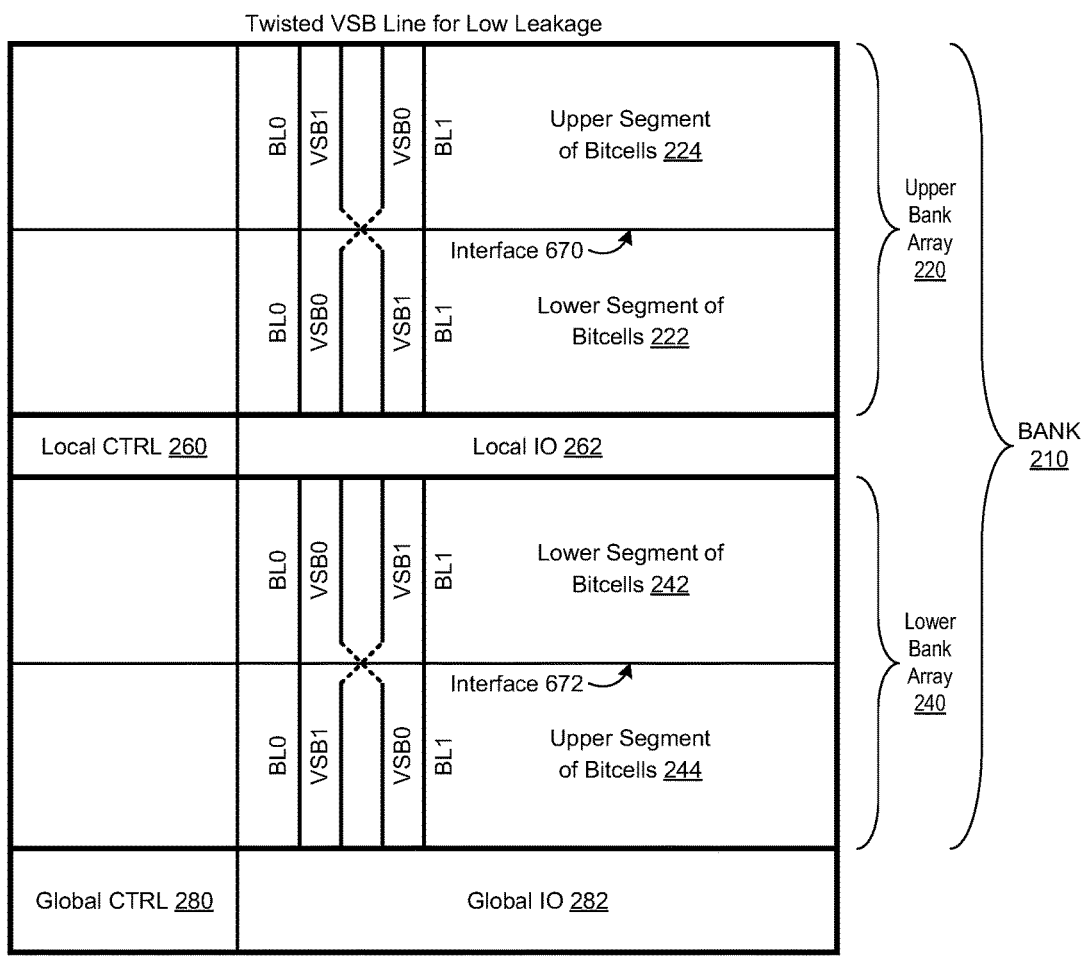

FIG. 6 illustrates a block diagram of another high density memory architecture 600 in accordance with various implementations described herein. As provided herein, the high density memory architecture 600 may be implemented in ROM as an integrated circuit with multiple banks having multiple bank arrays with segmented bitcells.

The high density memory architecture 600 is similar to the high density memory architecture 200 of FIG. 2 with some modification. For instance, as with the architecture 200 of FIG. 2, the architecture 600 of FIG. 6 may include a plurality of control lines (VSB/BL). However, as shown in the architecture 600 of FIG. 6, the plurality of control lines may include a plurality of continuous bitlines (BL0, BL1) and a plurality of twisted voltage supply lines (VSB0, VSB1). For instance, the first and second voltage supply lines (VSB0, VSB1) may be routed in column 1 and column 2, respectively, in the first segment of bitcells 222, 242 and then routed in column 2 and column 1, respectively, in the second segment of bitcells 224, 244 at the interfaces 670, 672 of the first and second segment of bitcells 222, 224, 242, 244. Further, in this instance, as shown in FIG. 6, this may form twisted voltage supply lines pairs (VSB0, VSB1). In some cases, the interfaces 670, 672 of the first and second segments of bitcells 222, 224, 242, 244 may refer to a shared boundary (or shared boundary line) disposed between the first and second segments of bitcells 222, 224, 242, 244.

Further, as shown in FIG. 6, the two adjacent voltage supply lines (VSB0, VSB1) may be twisted at the interfaces 670, 672 of the first (lower) and second (upper) segments of bitcells 222, 224, 242, 244. As shown, the first voltage supply line (VSB0) may form a VSB-BL pair with the first bitline (BL0) in the first (lower) segments 222, 242, while in the second (upper) segments 224, 244, the first voltage supply line (VSB0) may form a VSB-BL pair with the second bitline (BL1). Further, as shown, the second voltage supply line (VSB1) may form a VSB-BL pair with the second bitline (BL1) in the first (lower) segments 222, 242, while in the second (upper) segments 224, 244, the second voltage supply line (VSB1) may form a VSB-BL pair with the first bitline (BL0).

In some implementations, when voltage is supplied to the first segment of bitcells 222, 242 by the local control 260, 262 via the first voltage supply lines (VSB0), the second voltage supply lines (VSB1) may be deactivated by the local control 260, 262. Further, in other implementations, when voltage is supplied to the second segment of bitcells 224, 244 by the local control 260, 262 via the second voltage supply lines (VSB1), the first voltage supply lines (VSB0) may be deactivated by the local control 260, 262. In some cases, activating and deactivating the first and second voltage supply lines (VSB0, VSB1) may reduce leakage of the integrated circuit 600. Further, the plurality of control lines may include bitlines (BL0, BL1) coupling the local control 260, 262 to the first and second segments of bitcells 222, 224, 242, 244, and data stored in each of the bitcells may be accessible by the local control 260, 262 via the bitlines (BL0, BL1).

The high density memory architecture 600 of FIG. 6 provides a unique way to accommodate more rows per memory bank by using twisted VSB lines. For instance, in the architecture 600 of FIG. 6, based on max rows that may be supported for proper bitcell functionality, the bank array may be divided into two segments of bitcells, e.g., lower segments of bitcells 222, 242 and upper segments of bitcells 224, 244. Each segment may have max rows based on current on ($I_{ON}$) versus current off ($I_{OFF}$) criteria. The two adjacent VSB lines are twisted at the interfaces 570, 572 of the lower and upper segments 222, 224, 242, 244. In this instance, the first VSB line (VSB0) may form a VSB-BL pair with the first bitline (BL0) in the lower segment of bitcells 222, 242, while in the upper segment of bitcells 242, 244, the first VSB line (VSB0) may form a VSB-BL pair with the second bitline (BL1) in the upper segment of bitcells 224, 244. Based on both column and row addresses, if the first bitline (BL0) is selected in the lower segment of bitcells 222, 242, then the first voltage supply line (VSB0) is pulled low, while the second voltage supply line (VSB1) remains at a biasing voltage. Thus, in some cases, only bitcells in the lower segment of bitcells 222, 242 may contribute to the leakage of the first bitline (BL0), while the upper segment of bitcells 224, 244 may not contribute to the bitline discharge due to leakage. This may allow double the amount of bitcells for coupling to a single bitline, thus eliminating or at least reducing the need of one local IO 260, 262 for each bank. Further, this feature may reduce the number of memory banks and the logic associated with Local IO to thereby improve memory area. In some cases, this high density architectural scheme may offer a substantial reduction (e.g., 15% reduction) in overall area.

Further, in another implementation, the high density memory architecture 500 of FIG. 5 provides another unique way to accommodate more rows per memory bank by using twisted bitlines. For instance, in the architecture 500 of FIG. 5, the bitlines (BL0, BL1) are twisted, and the VSB lines (VSB0, VSB1) may run continuous. In some cases, this architecture 500 of FIG. 5 may offer a high density with the difference being that the jump (or twist) is on provided on bitline and not on VSB line.

In accordance with various implementations described herein with reference to FIGS. 5-6, a single metallization layer may be used to implement high density memory architecture, thus reducing some complexity related to higher metallization. For instance, half of a memory bank may be divided into two segments, and as such, each memory bank may have two sub-banks, e.g., lower and upper sub-banks, with each sub-bank may having two segments, e.g., lower and upper segments. As described in reference to FIG. 6, one VSB line may be twisted and flipped with another adjacent VSB line, and the first VSB line (VSB0) may serve as column 0 in the lower segment of bitcells 222, 242, while as VSB1 in the upper segment of bitcells 224, 244. Further, since the VSB lines couple to different columns in different segments (lower or upper), there may not be much area penalty when implementing pull-down logic of the VSB line. If higher metallization is used, it may need extra area due to extra pulldown logic.

Described herein are various implementations of an integrated circuit. In some implementations, the integrated circuit may include a plurality of bank arrays having multiple segments of bitcells configured to share local control. The integrated circuit may include a plurality of control lines coupling the local control to each of the multiple segments of bitcells. In some instances, during activation of a segment of bitcells by the local control via one of the control lines, another segment of bitcells may be deactivated by the local control via another of the control lines.

Described herein are various implementations of an integrated circuit. In some implementations, the integrated circuit may include a plurality of memory banks with each memory bank having first and second bank arrays configured to share local control, and each bank array may include a first segment of bitcells and a second segment of bitcells separated by an isolation cell. The integrated circuit may include a plurality of control lines including a first control line coupling the local control to the first segment of bitcells and a second control line coupling the local control to the second segment of bitcells. In some instances, during activation of the first segment of bitcells by the local control via the first control line, the second control line may be deactivated by the local control. In other instances, during activation of the second segment of bitcells by the local control via the second control line, the first control line may be deactivated by the local control.

Described herein are various implementations of an integrated circuit. In some implementations, the integrated circuit may include a plurality of memory banks with each memory bank having first and second bank arrays configured to share local control, and each bank array may include a first segment of bitcells and a second segment of bitcells. The integrated circuit may include a plurality of twisted control lines having first and second control lines routed to the first segment of bitcells and then routed to the second segment of bitcells at an interface of the first and second segment of bitcells. In some instances, during activation of the first segment of bitcells by the local control via the first control line, the second control line may be deactivated by the local control. In other instances, during activation of the second segment of bitcells by the local control via the second control line, the first control line may be deactivated by the local control.

Although particular embodiments have been described herein, it will be apparent that these particular embodiments should not be limited thereto, and that many modifications and/or additions may be made within the particular embodiments of the disclosure. For instance, various combinations of features of the dependent claims may be made with features of the independent claims without departing from the particular embodiments.

Further, various techniques of embodiments described herein are applicable across a variety of technologies, and for various different types of memory cells. For instance, particular embodiments may be used irrespective of whether individual memory cells are constructed using bulk CMOS (Complementary Metal-Oxide-Semiconductor) technology or constructed using SOI (Silicon-On-Insulator) technology or FinFET technology. Further, various techniques of embodiments described herein are not restricted to memory devices using memory cells, but may be applied to memory devices using various other types of memory cells that are subjected to read and/or write operations.

Still further, various techniques of embodiments described herein may be implemented with an NMOS matrix and NMOS keeper. However, in reference to CMOS technology, various techniques of embodiments described herein may be implemented with a PMOS matrix and a PMOS keeper. Therefore, various techniques of embodiments described herein refer to matching the device type of the keeper/bleeder with the device type of the matrix (i.e., the device type needing leakage compensation).

The discussion provided herein is directed to certain specific implementations. It should be understood that the discussion provided herein is provided for the purpose of enabling a person with ordinary skill in the art to make and use any subject matter defined herein by the subject matter of the claims.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve a developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
a plurality of bank arrays having multiple segments of bitcells configured to share local control; and
a plurality of control lines coupling the local control to each of the multiple segments of bitcells;
wherein, during activation of a segment of bitcells by the local control via one of the control lines, another segment of bitcells is deactivated by the local control via another of the control lines,
wherein the multiple segments of bitcells are separated by an isolation cell,
wherein the plurality of control lines comprise a first control line coupling the local control to the segment of bitcells as a first segment of bitcells and a second control line coupling the local control to the another segment of bitcells as a second segment of bitcells,
during activation of the first segment of bitcells by the local control via the first control line, the second control line is deactivated by the local control,
during activation of the second segment of bitcells by the local control via the second control line, the first control line is deactivated by the local control, and
wherein the first control line comprises a first bitline, wherein the second control line comprises a second bitline, and wherein activating and deactivating the first and second bitlines increases performance of the integrated circuit.

2. An integrated circuit, comprising:
a plurality of bank arrays having multiple segments of bitcells configured to share local control; and
a plurality of control lines coupling the local control to each of the multiple segments of bitcells,
wherein, during activation of a segment of bitcells by the local control via one of the control lines, another segment of bitcells is deactivated by the local control via another of the control lines,
wherein the multiple segments of bitcells are separated by an isolation cell,
wherein the plurality of control lines comprise a first control line coupling the local control to the segment of bitcells as a first segment of bitcells and a second control line coupling the local control to the another segment of bitcells as a second segment of bitcells,
during activation of the first segment of bitcells by the local control via the first control line, the second control line is deactivated by the local control,
during activation of the second segment of bitcells by the local control via the second control line, the first control line is deactivated by the local control, and
wherein the first control line comprises a first voltage supply line, wherein the second control line comprises a second voltage supply line, and wherein activating and deactivating the first and second voltage supply lines reduces leakage of the integrated circuit.

3. The integrated circuit of claim 1, wherein:
the plurality of control lines comprises a plurality of twisted control lines having first and second control lines;
the segment of bitcells comprises a first segment of bitcells; and
the another segment of bitcells comprises a second segment of bitcells.

4. The integrated circuit of claim 3, wherein:
the first and second control lines are routed to the first segment of bitcells and then routed to the second segment of bitcells at an interface of the first and second segment of bitcells;

during activation of the first segment of bitcells by the local control via the first control line, the second control line is deactivated by the local control; and during activation of the second segment of bitcells by the local control via the second control line, the first control line is deactivated by the local control.

5. An integrated circuit, comprising:

a plurality of bank arrays having multiple segments of bitcells configured to share local control; and a plurality of control lines coupling the local control to each of the multiple segments of bitcells, wherein, during activation of a segment of bitcells by the local control via one of the control lines, another segment of bitcells is deactivated by the local control via another of the control lines, wherein:

the plurality of control lines comprises a plurality of twisted control lines having first and second control lines;

the segment of bitcells comprises a first segment of bitcells;

the another segment of bitcells comprises a second segment of bitcells, wherein:

the first and second control lines are routed to the first segment of bitcells and then routed to the second segment of bitcells at an interface of the first and second segment of bitcells;

during activation of the first segment of bitcells by the local control via the first control line, the second control line is deactivated by the local control; and during activation of the second segment of bitcells by the local control via the second control line, the first control line is deactivated by the local control, and wherein the first control line comprises a first bitline, wherein the second control line comprises a second bitline, and wherein activating and deactivating the first and second bitlines reduces leakage of the integrated circuit.

6. An integrated circuit, comprising:

a plurality of bank arrays having multiple segments of bitcells configured to share local control; and a plurality of control lines coupling the local control to each of the multiple segments of bitcells, wherein, during activation of a segment of bitcells by the local control via one of the control lines, another segment of bitcells is deactivated by the local control via another of the control lines, wherein:

the plurality of control lines comprises a plurality of twisted control lines having first and second control lines;

the segment of bitcells comprises a first segment of bitcells;

the another segment of bitcells comprises a second segment of bitcells, wherein:

the first and second control lines are routed to the first segment of bitcells and then routed to the second segment of bitcells at an interface of the first and second segment of bitcells;

during activation of the first segment of bitcells by the local control via the first control line, the second control line is deactivated by the local control; and during activation of the second segment of bitcells by the local control via the second control line, the first control line is deactivated by the local control, and wherein the first control line comprises a first voltage supply line, wherein the second control line comprises a second voltage supply line, and wherein activating and deactivating the first and second voltage supply lines reduces leakage of the integrated circuit.

7. An integrated circuit, comprising:

a plurality of memory banks with each memory bank having first and second bank arrays configured to share local control, wherein each bank array includes a first segment of bitcells and a second segment of bitcells separated by an isolation cell; and a plurality of control lines including a first control line coupling the local control to the first segment of bitcells and a second control line coupling the local control to the second segment of bitcells, wherein, during activation of the first segment of bitcells by the local control via the first control line, the second control line is deactivated by the local control, wherein, during activation of the second segment of bitcells by the local control via the second control line, the first control line is deactivated by the local control, and wherein the first control line comprises a first bitline, wherein the second control line comprises a second bitline, and wherein activating and deactivating the first and second bitlines increases performance of the integrated circuit.

8. The integrated circuit of claim 7, wherein each segment of bitcells of each bank array includes a plurality of bitcells arranged in columns and rows, and wherein data stored in each of the bitcells is accessible via the first and second bitlines.

9. The integrated circuit of claim 7, wherein the plurality of control lines include a voltage supply line coupling the local control to the first and second segments of bitcells, and wherein voltage is supplied to each of the bitcells via the voltage supply line.

10. An integrated circuit, comprising:

a plurality of memory banks with each memory bank having first and second bank arrays configured to share local control, wherein each bank array includes a first segment of bitcells and a second segment of bitcells separated by an isolation cell; and a plurality of control lines including a first control line coupling the local control to the first segment of bitcells and a second control line coupling the local control to the second segment of bitcells, wherein, during activation of the first segment of bitcells by the local control via the first control line, the second control line is deactivated by the local control, wherein, during activation of the second segment of bitcells by the local control via the second control line, the first control line is deactivated by the local control, and wherein the first control line comprises a first voltage supply line, wherein the second control line comprises a second voltage supply line, and wherein activating and deactivating the first and second voltage supply lines reduces leakage of the integrated circuit.

11. The integrated circuit of claim 10, wherein each segment of bitcells of each bank array includes a plurality of bitcells arranged in columns and rows, and wherein voltage is supplied to each of the bitcells via the first and second voltage supply lines.

12. The integrated circuit of claim 10, wherein the plurality of control lines include a bitline coupling the local control to the first and second segments of bitcells, and wherein data stored in each of the bitcells is accessible via the bitline.

13. An integrated circuit, comprising:
a plurality of memory banks with each memory bank having first and second bank arrays configured to share local control, wherein each bank array includes a first segment of bitcells and a second segment of bitcells; and
a plurality of twisted control lines having first and second control lines routed to the first segment of bitcells and then routed to the second segment of bitcells at an interface of the first and second segment of bitcells,
wherein, during activation of the first segment of bitcells by the local control via the first control line, the second control line is deactivated by the local control,
wherein, during activation of the second segment of bitcells by the local control via the second control line, the first control line is deactivated by the local control, and
wherein:
the first control line comprises a first bitline;
the second control line comprises a second bitline;
activating and deactivating the first and second bitlines increases performance of the integrated circuit;
the plurality of control lines includes a voltage supply line coupling the local control to the first and second segments of bitcells; and
voltage is supplied to each of the bitcells via the voltage supply line.

14. The integrated circuit of claim 13, wherein the interface of the first and second segments of bitcells comprises a shared boundary between the first and second segments of bitcells.

15. An integrated circuit, comprising:
a plurality of memory banks with each memory bank having first and second bank arrays configured to share local control, wherein each bank array includes a first segment of bitcells and a second segment of bitcells; and
a plurality of twisted control lines having first and second control lines routed to the first segment of bitcells and then routed to the second segment of bitcells at an interface of the first and second segment of bitcells,
wherein, during activation of the first segment of bitcells by the local control via the first control line, the second control line is deactivated by the local control,
wherein, during activation of the second segment of bitcells by the local control via the second control line, the first control line is deactivated by the local control, and
wherein:
the first control line comprises a first voltage supply line;
the second control line comprises a second voltage supply line;
activating and deactivating the first and second voltage supply lines reduces leakage of the integrated circuit;
the plurality of control lines include a bitline coupling the local control to the first and second segments of bitcells; and
data stored in each of the bitcells is accessible via the bitline.

* * * * *